United States Patent
Koudymov et al.

(10) Patent No.: US 7,560,985 B2
(45) Date of Patent: Jul. 14, 2009

(54) TWO-STAGE AMPLIFICATION USING INTERMEDIATE NON-LINEAR SQUARE WAVE

(75) Inventors: Alexei Koudymov, Troy, NY (US); Michael Shur, Latham, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 72 days.

(21) Appl. No.: 11/746,093

(22) Filed: May 9, 2007

(65) Prior Publication Data
US 2008/0150634 A1 Jun. 26, 2008

Related U.S. Application Data

(60) Provisional application No. 60/877,175, filed on Dec. 26, 2006, provisional application No. 60/877,177, filed on Dec. 26, 2006.

(51) Int. Cl.
H03F 3/217 (2006.01)
(52) U.S. Cl. .................... 330/251; 330/277
(58) Field of Classification Search ............ 330/98, 330/150, 251, 310, 207 A, 277, 307
See application file for complete search history.

(56) References Cited

U.S. PATENT DOCUMENTS

| 5,939,941 | A | * | 8/1999 | Nair et al. ............ 330/251 |
| 6,359,513 | B1 | | 3/2002 | Kuo et al. |
| 6,861,907 | B2 | | 3/2005 | Gotou |
| 7,151,407 | B2 | | 12/2006 | Grundlingh |

OTHER PUBLICATIONS

Gao et al., "Two-Stage Quasi-Class-E Power Amplifier in GaN HEMT Technology," IEEE Microwave and Wireless Components Letters, 2006, pp. 1-3.
Higashiwaki et al., "AlGaN/GaN MIS-HFETs With fT of 163 GHz Using Cat-CVD SiN Gate-Insulating and Passivation Layers," IEEE Electron Device Letters, vol. 27, No. 1, Jan. 2006, pp. 16-18.
Kee et al., "The Class-E/F Family of ZVS Switching Amplifiers," IEEE Transactions on Microwave Theory and Techniques, vol. 51, No. 6, Jun. 2003, pp. 1677-1690.
PCT International Search Report and Written Opinion; May 26, 2008; 10 pages.

* cited by examiner

*Primary Examiner*—Khanh V Nguyen
(74) *Attorney, Agent, or Firm*—Hoffman Warnick LLC

(57) ABSTRACT

A two-stage amplifier is provided, which in the first stage, a first amplifier generates a non-linear square wave based on a harmonic input. The non-linear square wave has the same frequency as the harmonic input and is provided as an input to the second stage, in which a second amplifier generates an amplified harmonic output. The first amplifier and/or second amplifier can comprise a group-III nitride-based Heterostructure Field Effect Transistor (HFET). Additionally, the first amplifier can comprise a multi-harmonic Class F amplifier and the second amplifier can comprise a Class E amplifier.

20 Claims, 8 Drawing Sheets

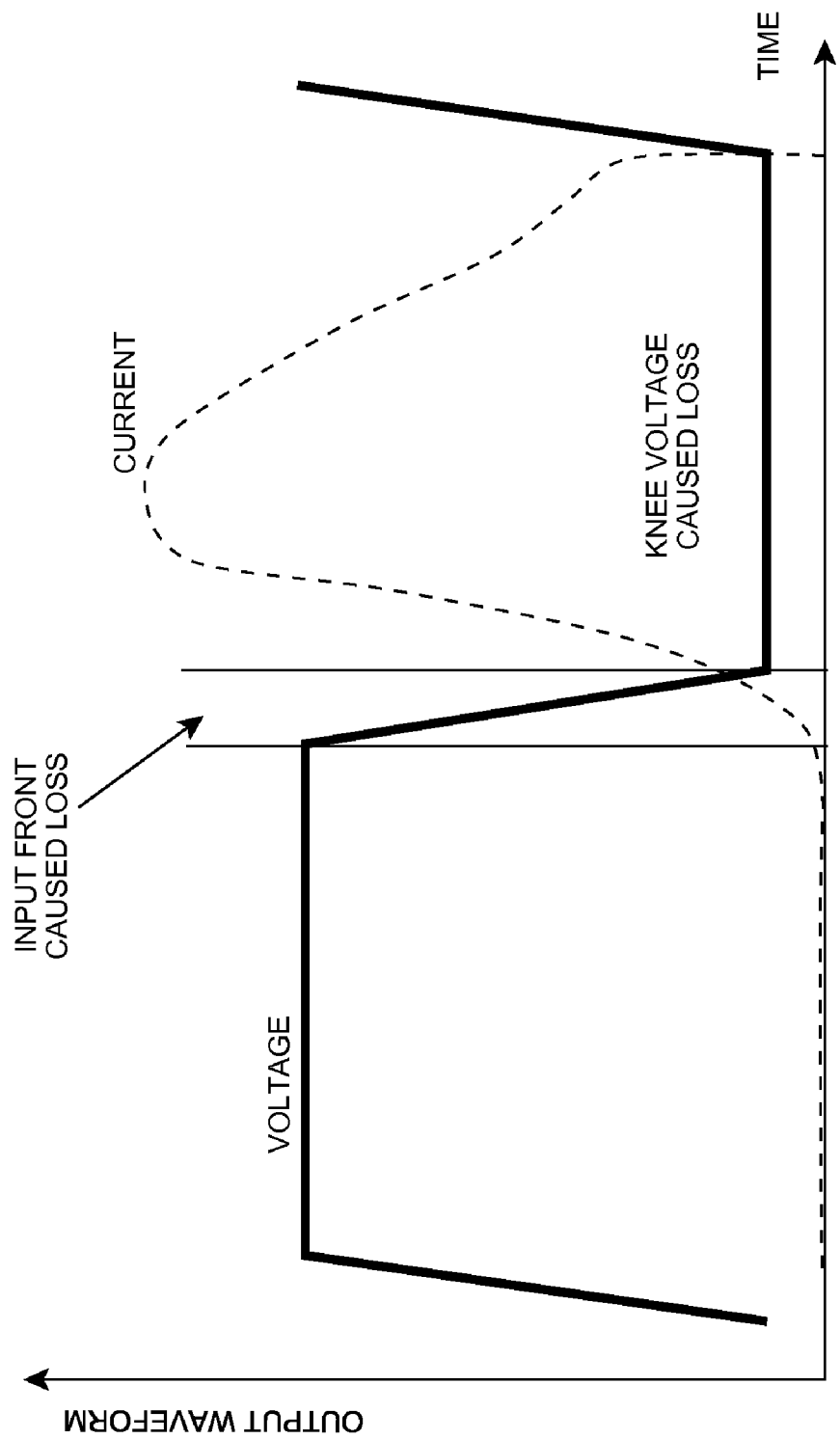

TWO-STAGE AMPLIFICATION USING INTERMEDIATE NON-LINEAR SQUARE WAVE

REFERENCE TO PRIOR APPLICATIONS

The current application claims the benefit of U.S. Provisional Application No. 60/877,175, entitled "Profiled gate transistor structure with enhanced high harmonic gain for GaN-based switching mode RF amplifier", which was filed on 26 Dec. 2006 and U.S. Provisional Application No. 60/877,177, entitled "GaN-based class FN-E switching mode RF amplifier with enhanced performance stability", which was filed on 26 Dec. 2006, both of which are hereby incorporated by reference. The application is also related to the co-pending U.S. Utility application Ser. No. 11/746,088, entitled "Profiled gate field effect transistor with enhanced high harmonic gain", which was filed on 9 May 2007, and which is hereby incorporated by reference.

FIELD OF THE DISCLOSURE

Aspects of the invention relate generally to amplifiers, and more particularly, to a two-stage amplifier circuit that uses an intermediate non-linear square wave.

BACKGROUND OF THE DISCLOSURE

In general, when compared to other semiconductor devices, Gallium Nitride (GaN)-based high electron mobility transistors (HEMTs) can produce superior RF power densities. The superior performance is due to a high breakdown voltage, low channel resistance, high carrier density, as well as high saturation velocities and a lateral layout allowing for a short gate design. Additionally, the ability of GaN-based HEMTs to operate at high ambient temperatures makes them attractive for many practical applications.

Currently, use of GaN-based Heterostructure Field Effect Transistors (HFETs), such as metal-oxide-semiconductor HFETs (MOSHFETs), metal-insulator-semiconductor HFETs (MISHFETs), and modifications thereof, as RF power amplifiers is limited by the operating stability and self-heating effects of the HFETs. In particular, the operating stability of a state-of-the-art GaN-based HFET is very sensitive to the operating conditions, such as a maximum drain bias, instant peak and average gate voltages, and self-heating effects. In order to minimize the self-heating effects, as well as for energy conservation, it is important to achieve high efficiency operation of the HFET.

However, traditional approaches of enhancing the operating efficiency require specific operating conditions that reduce the stable operation time of the HFET. In particular, the stable operation time for the HFET can drop from thousands of hours to minutes or seconds, even just a few RF cycles.

BRIEF SUMMARY OF THE DISCLOSURE

Aspects of the invention provide a two-stage amplifier, which in the first stage, a first amplifier generates a non-linear square wave based on a harmonic input. The non-linear square wave has the same frequency as the harmonic input and is provided as an input to the second stage, in which a second amplifier generates an amplified harmonic output. The first amplifier and/or second amplifier can comprise a group-III nitride-based Heterostructure Field Effect Transistor (HFET). Additionally, the first amplifier can comprise a multi-harmonic Class F amplifier and the second amplifier can comprise a Class E amplifier. The circuit provides efficient conversion of DC power to RF power as well as an extended period of stable operation.

A first aspect of the invention provides an amplifier circuit comprising: a multi-harmonic Class F amplifier; and an active amplifier, wherein an output of the Class F amplifier comprises an input of the active amplifier.

A second aspect of the invention provides a circuit comprising: a first field effect transistor (FET) operating as a multi-harmonic Class F amplifier; and an active FET, wherein an output of the Class F amplifier comprises an input of a gate of the active FET.

A third aspect of the invention provides a method of amplifying a signal, the method comprising: receiving a harmonic input signal; generating a non-linear square wave based on the harmonic input signal using a first amplifier; providing the non-linear square wave as an input to a second amplifier; and amplifying the non-linear square wave using the second amplifier.

Additional aspects of the invention provide alternative circuits, amplifiers, and methods for amplifying a signal, as well as a method of manufacturing an amplifier circuit by implementing the components described herein using any solution.

The illustrative aspects of the invention are designed to solve one or more of the problems herein described and/or one or more other problems not discussed.

BRIEF DESCRIPTION OF THE SEVERAL VIEWS OF THE DRAWINGS

These and other features of the invention will be more readily understood from the following detailed description of the various aspects of the invention taken in conjunction with the accompanying drawings that depict various embodiments of the invention.

FIG. 6 shows an illustrative power loss diagram of a FET operating as a Class E amplifier with a non-linear square wave input according to an embodiment.

It is noted that the drawings are not to scale. The drawings are intended to depict only typical aspects of the invention, and therefore should not be considered as limiting the scope of the invention. In the drawings, like numbering represents like elements between the drawings.

DETAILED DESCRIPTION

As indicated above, aspects of the invention provide a two-stage amplifier, which in the first stage, a first amplifier generates a non-linear square wave based on a harmonic input. The non-linear square wave has the same frequency as the harmonic input and is provided as an input to the second stage, in which a second amplifier generates an amplified harmonic output. The first amplifier and/or second amplifier can comprise a group-III nitride-based Heterostructure Field Effect Transistor (HFET). Additionally, the first amplifier can comprise a multi-harmonic Class F amplifier and the second amplifier can comprise a Class E amplifier. The circuit provides efficient conversion of DC power to RF power as well as an extended period of stable operation. As used herein, unless otherwise noted, the term "set" means one or more (i.e., at least one) and the phrase "any solution" means any now known or later developed solution.

Figure 1:
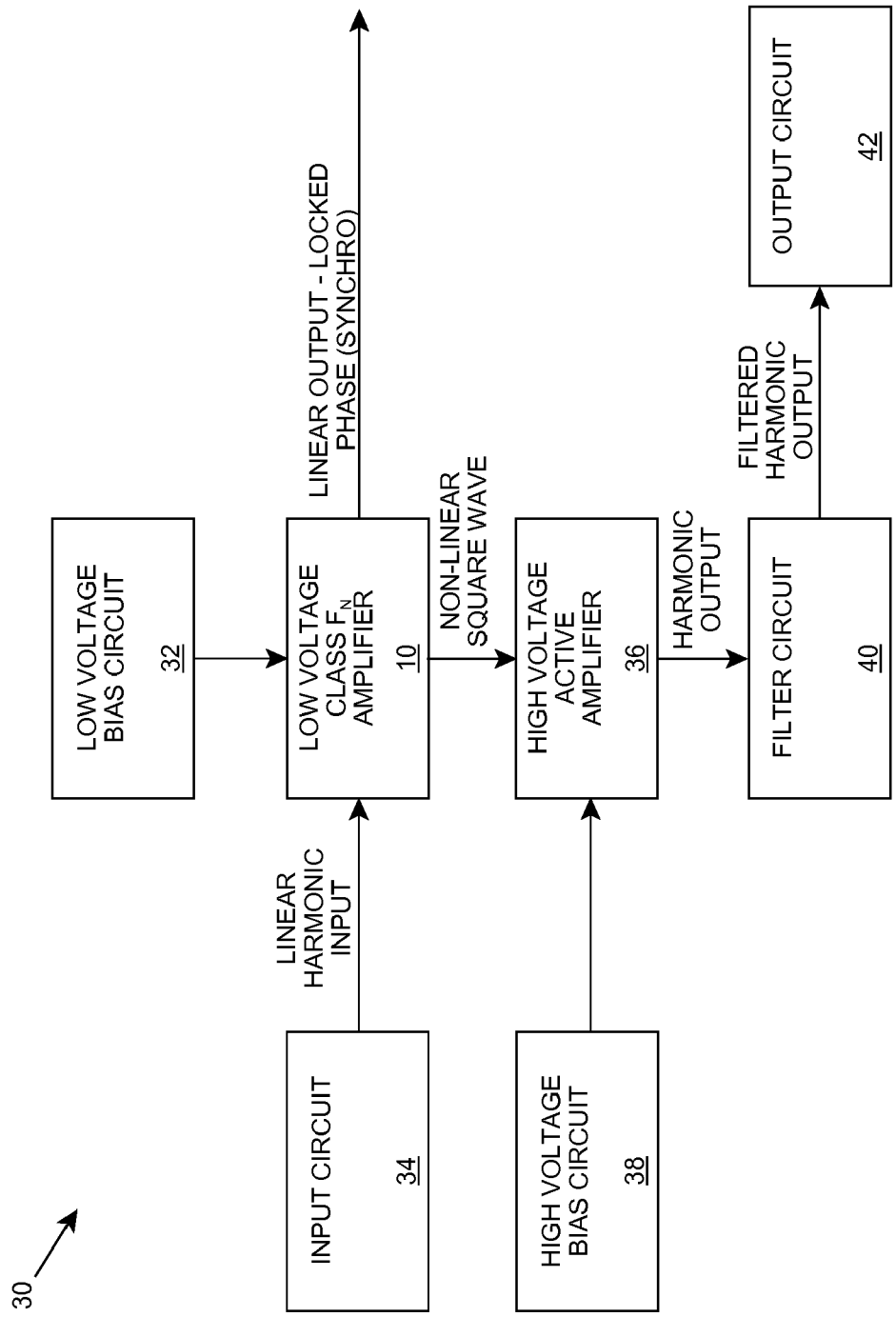
FIG. 1 shows a block diagram of an illustrative amplifier circuit according to an embodiment.

Turning to the drawings, FIG. 1 shows a block diagram of an illustrative switching mode radio frequency (RF) amplifier circuit 30 according to an embodiment. Circuit 30 includes a first amplifier 10 and an active amplifier 36. In particular, first amplifier 10 comprises a low voltage Class $F_N$ amplifier, where N comprises a number of supported harmonics, while active amplifier 36 can comprise, for example, a high voltage Class E amplifier. In this case, circuit 10 can comprise a Class $F_N$-E amplifier, which comprises a hybrid amplifier that combines the principles of operation of class F amplifiers with the possibility of additional harmonics, and class E amplifiers.

In any event, circuit 30 has two stages, both of which operate in switching mode. During operation of circuit 30, a low voltage bias circuit 32 generates and applies a voltage bias to first amplifier 10 and a high voltage bias circuit 38 generates and applies a voltage bias to active amplifier 36. In the first stage, input circuit 34 generates and applies a linear harmonic input to first amplifier 10. First amplifier 10 generates a locked phase synchronization output, which can be completely or partially used to form an amplifier, transmitter, receiver array, and/or the like. Additionally, first amplifier 10 can convert the harmonic input into a non-linear square wave, which is provided as an input to active amplifier 36. In the second stage, active amplifier 36 generates a harmonic output based on the non-linear square wave and the voltage bias. The harmonic output can be filtered by a filter circuit 40 before being provided for use by an output circuit 42.

Bias circuits 32, 38 can generate the respective voltage biases using any solution. Similarly, filter circuit 40 can filter the harmonic output generated by active amplifier 36 using any solution. Input circuit 34 and output circuit 42 can comprise any types of circuits for generating a linear harmonic input, and utilizing the output, respectively. In an embodiment, input circuit 34 generates a linear harmonic input having a frequency up to approximately one-one hundredth a cut-off frequency of first amplifier 10 in order to provide reasonable harmonic content to form the non-linear square wave (meander). For example, for a first amplifier 10 having a cut-off frequency between approximately 60-80 Gigahertz (GHz), input circuit 34 can generate a linear harmonic input having a frequency up to approximately 800 Megahertz (MHz). In an embodiment, circuit 30 can operate as a high power amplifier, in which high voltage bias circuit 38 provides a voltage bias of at least approximately 50 Volts (e.g., a range of approximately 50-70 Volts) and output circuit 42 comprises a high power circuit. Illustrative applications for circuit 30 include a radar, a wireless communication unit, various types of power converters, and/or the like. It is understood that the ranges cited herein are only illustrative. To this extent, various applications may use lower ranges, and higher ranges also may be implemented. For example, amplifiers 10 having cut-off frequencies as high as 163 GHz have been shown (which would enable an input frequency up to approximately 1.6 GHz).

Figure 2:
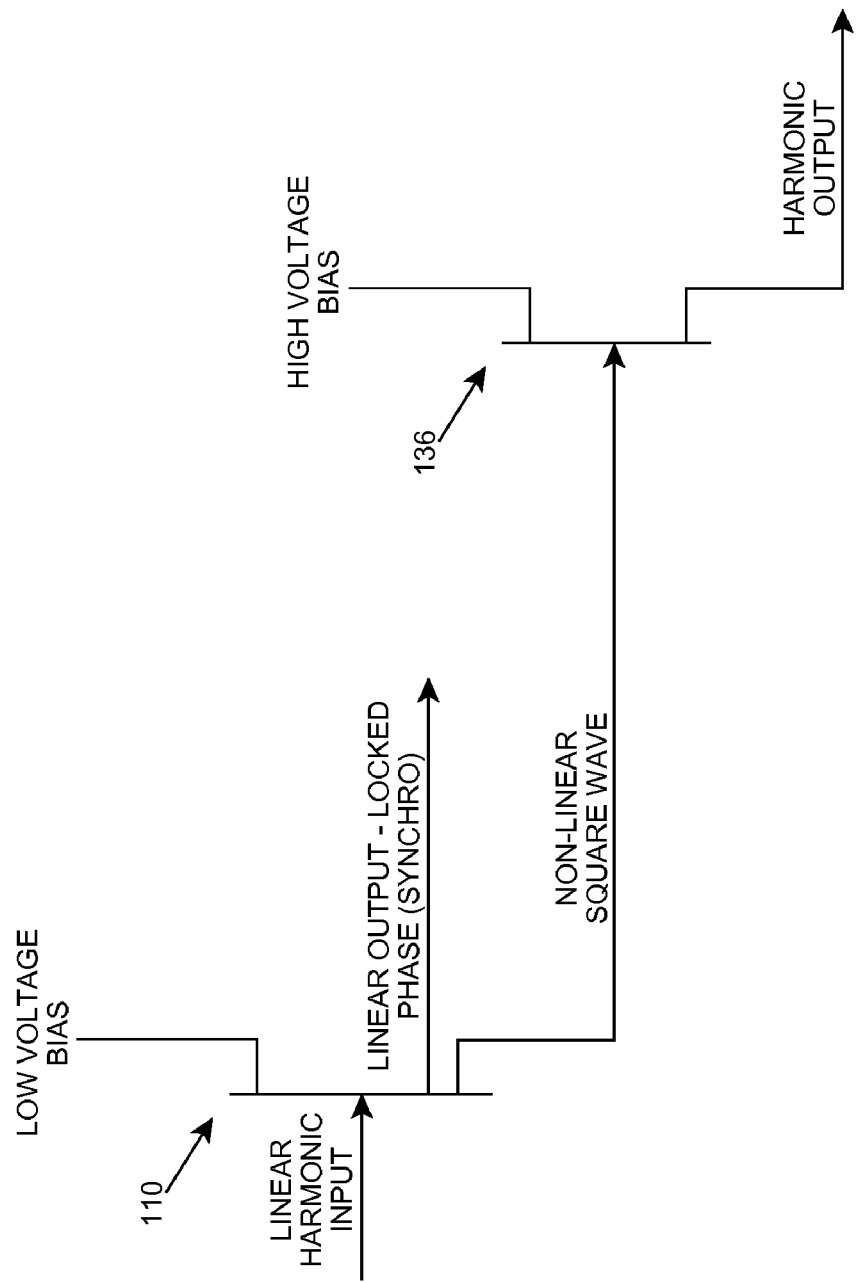
FIG. 2 shows an illustrative implementation of the amplifiers of the amplifier circuit of FIG. 1 according to an embodiment.

An illustrative implementation of amplifiers 10, 36 of circuit 30 is shown in FIG. 2 according to an embodiment. In particular, amplifiers 10, 36 (FIG. 1) are shown implemented as a first field effect transistor (FET) 110, and an active FET 136, respectively. One or both FETs 110, 136 can comprise a Heterostructure Field Effect Transistor (HFET). FET(s) 110, 136 can comprise any type of HFET including, but not limited to, a Schottky HFET, a metal-oxide-semiconductor HFET (MOSHFET), metal-insulator-semiconductor HFET (MISHFET), an insulated gate HFET (IG-HFET), a double heterojunction FET (DHFET), a metal-oxide-semiconductor DHFET (MOSDHFET), a metal-insulator-semiconductor DHFET (MISDHFET), and/or the like (e.g., other HFETs with similar stability diagrams). Further, in an embodiment, FET(s) 110, 136 is/are constructed using group-III nitride-based material(s), such as binary, ternary, and/or quaternary material(s) selected from $Al_xGa_yIn_zN$, where $0 \leq X, Y, Z \leq 1$, and $X+Y+Z=1$. Additionally, FET(s) 110, 136 can include any type of gate insulating material to provide gate insulation. For example, for a MISHFET or a MISDHFET, the gate insulating material can be silicon nitride, aluminum oxide, and/or other dielectrics or compound dielectric structures having a high dielectric constant (high-k). Similarly, for a MOSHFET or a MOSDHFET, the gate insulating material can be silicon oxide, silicon oxynitride, and/or other dielectrics or compound dielectric structures. Still further, FET(s) 110, 136 also can include one or more field plates, which can be electrically connected to a gate, drain, and/or source of the FET 110, 136 using any solution.

As illustrated, the linear harmonic input is applied to a gate of FET 110, and a low voltage bias is applied to a source of FET 110. The locked phase synchronization output can be obtained from a drain of FET 110, and the non-linear square wave can be obtained from a drain of FET 110. The non-linear square wave is applied to the gate of FET 136. A high voltage bias is applied to a drain of FET 136, and the harmonic output is obtained from a source of FET 136. As discussed herein, FET 110 can operate as a multi-harmonic Class F amplifier (Class $F_N$ amplifier, where N represents a number of supported harmonics and is greater than 1). Additionally, FET 136 can operate as a Class E amplifier. FETs 110, 136 can be manufactured using any solution. In an embodiment, FETs 110, 136 are monolithically integrated on a chip.

Figure 3:
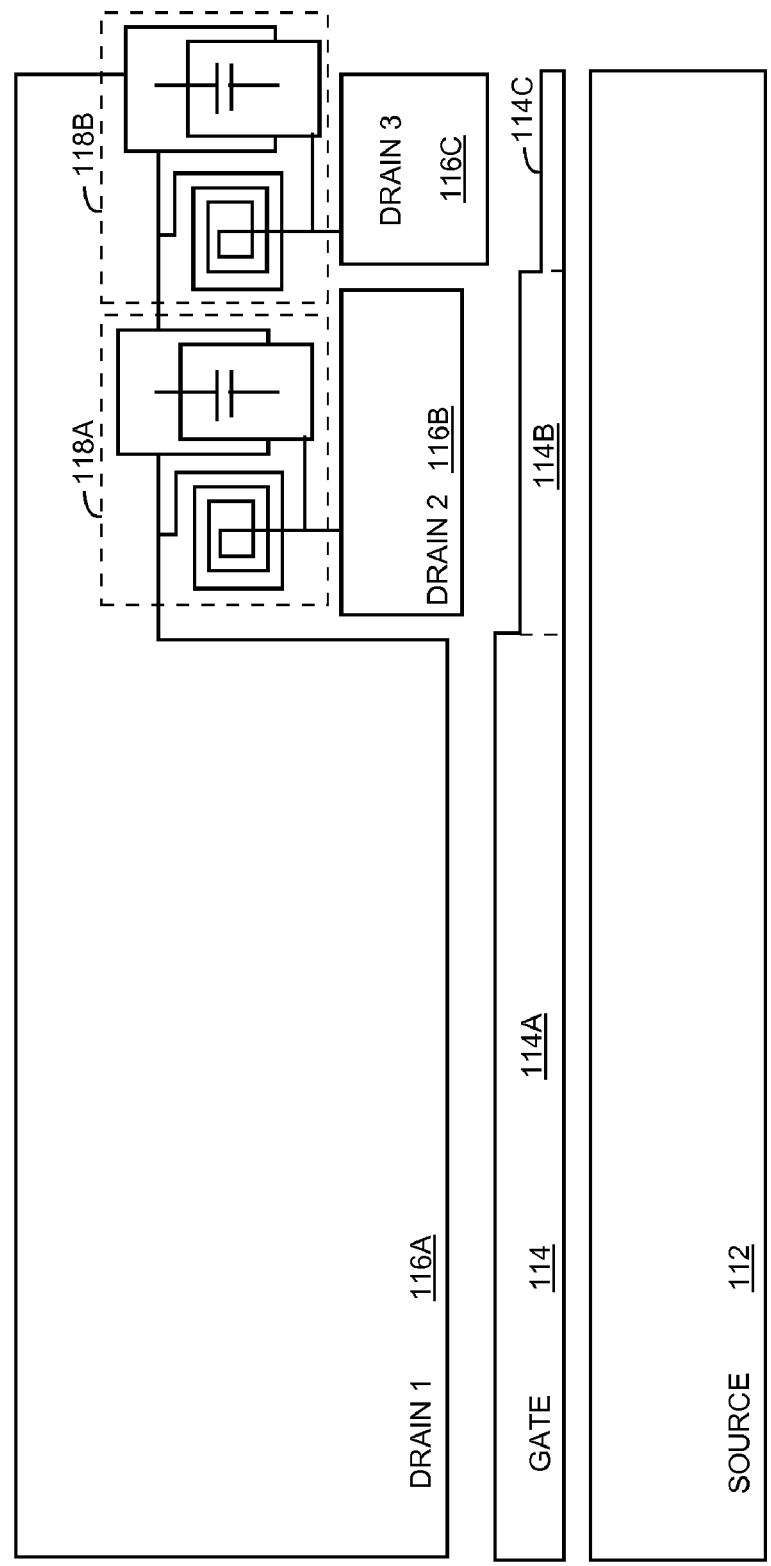
FIG. 3 shows an illustrative implementation of the first FET in FIG. 2 according to an embodiment.

FIG. 3 shows an illustrative implementation of FET 110 according to an embodiment. As shown and described more fully in U.S. Utility application Ser. No. 11/746,088, entitled "Profiled gate field effect transistor with enhanced high harmonic gain", which was filed on 9 May 2007, and which was previously incorporated by reference, FET 110 includes a common electrode 112 (e.g., a source electrode), a common gate 114, and a plurality of separate second electrodes 116A-C (e.g., drain electrodes) with LC resonators 118A-B electrically connected between them. Gate 114 is profiled, thereby forming a plurality of gate sections 114A-C, each of which corresponds to a unique one of the plurality of separate second electrodes 116A-C that opposes the corresponding gate section 114A-C. Each gate section 114A-C and separate electrode 116A-C pair corresponds to a unique supported harmonic of FET 110.

Figure 4:
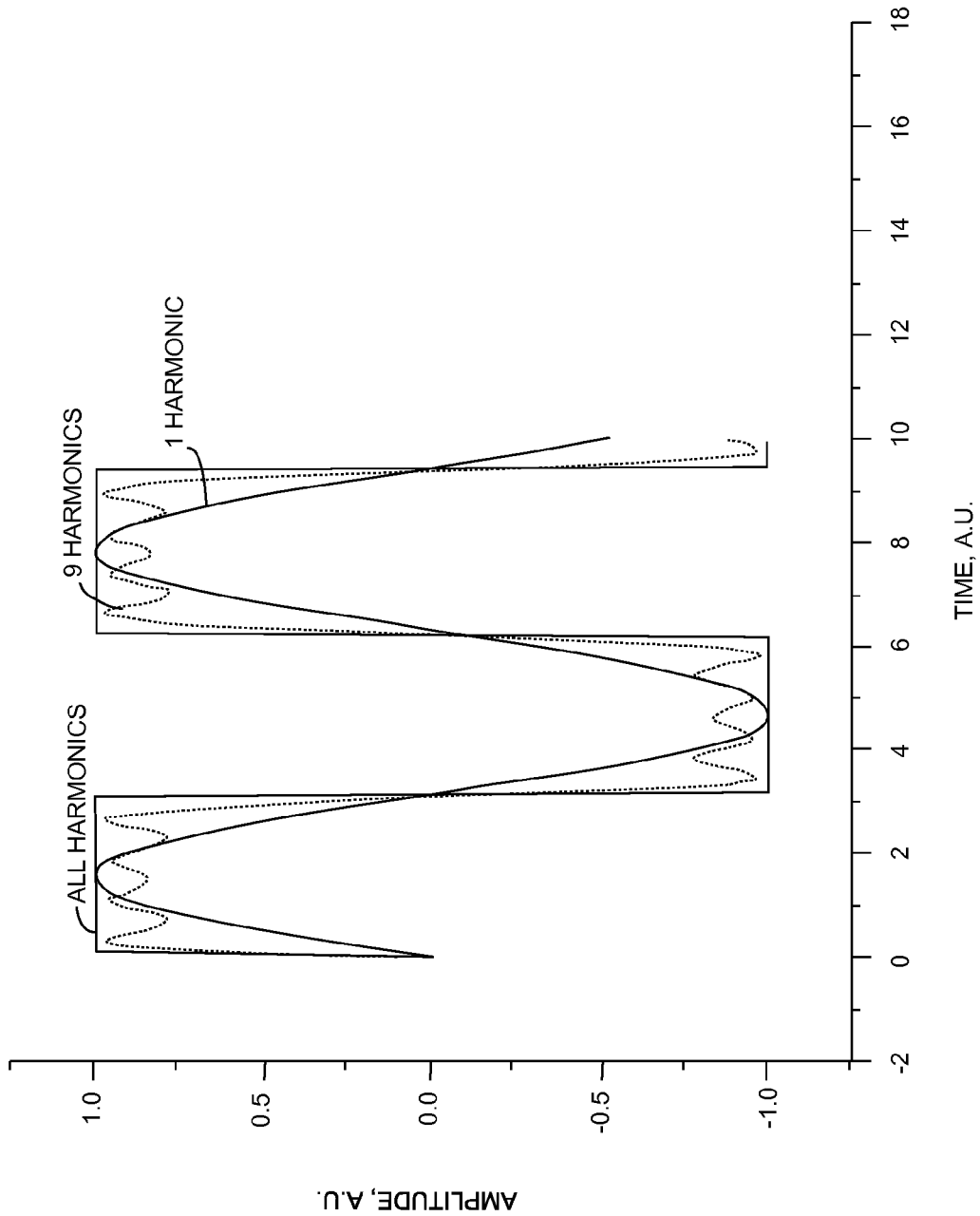
FIG. 4 shows an illustrative non-linear square wave according to an embodiment.

When operated as a Class $F_N$ amplifier, FET 110 generates a non-linear square wave once a load is attached to second electrodes 116A-C. FET 110 illustrates a Class $F_5$ amplifier, in which harmonics 1, 3, and 5 are used to generate the non-linear square wave. In practice, a number of possible harmonics for FET 110 is only limited by the cut-off frequency of the corresponding gate area. FIG. 4 shows an illustrative non-linear square wave according to an embodiment. In particular, a non-linear square wave corresponding to nine supported harmonics is shown. Additionally, a single harmonic wave and a wave corresponding to all harmonics are shown for comparison. When a load is not attached to second electrodes 116A-C, the single harmonic wave can be obtained from electrode 116A, and can be used as the locked phase synchronization output shown in FIGS. 1 and 2.

As a number of supported harmonics increases, the non-linear square wave generated by the first amplifier 10 (FIG. 1) will approach a square wave (all harmonics). To this extent, both a sharpness of a front between the positive and negative peak states as well as a flatness of each peak state improve as the number of harmonics increases. As a sharpness of the signal front for the output signal of first amplifier 10 increases, energy loss in active amplifier 36 (FIG. 1) due to the transient reduces, which enables amplifier circuit 30 (FIG. 1) to approach an ideal case of practically bias independent energy loss that is associated only with the on-state heat dissipation. Further, the flatness of the peak will mostly improve the stability of active amplifier 36 by reducing the negative and positive spikes of the input signal. As a result, the number of harmonics in first amplifier 10 can be extended as a trade-off between the efficiency of active amplifier 36 and circuit complexity. Further, the feedback circuit of amplifier circuit 30 can use the transconductance non-linearity of FET 110 (FIG. 3) and/or the non-linearity of the output capacitance related to the field plate design (when incorporated in FET 110) as a source(s) of high harmonics.

Returning to FIG. 2, additional aspects are described in conjunction with an illustrative implementation in which FET 110 comprises a group-III nitride-based HFET operating as a Class $F_N$ amplifier, and FET 136 comprises a group-III nitride-based HFET operating as a Class E amplifier. FET 110 generates and provides the non-linear square wave as an input to FET 136. As an input for FET 136, such a waveform leads to quasi-Class A operation of FET 136 with respect to the average gate bias. In this manner, FET 110 can ensure that FET 136 only operates above its corresponding threshold voltage (i.e., the lower (negative) voltage at which the transconductance of FET 136 drops to one percent of its peak) or in the near sub-threshold regime of FET 136. The near sub-threshold regime is a voltage range below the threshold voltage with a width of an active driving voltage range, which is defined as a voltage range from threshold to peak transconductance.

Figure 5:
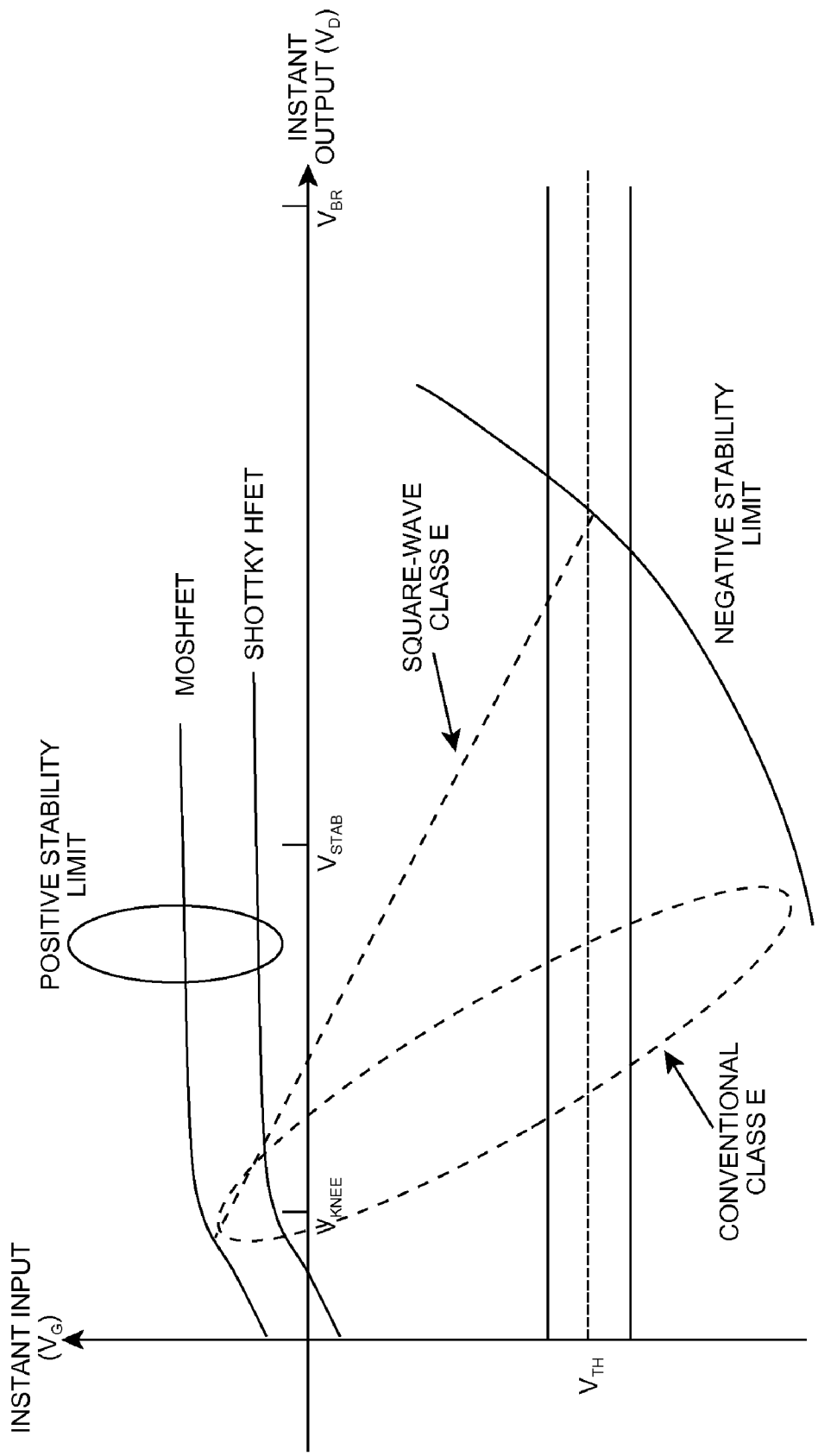
FIG. 5 shows an illustrative diagram comparing operation of a group-III nitride-based HFET with both harmonic and non-linear square wave inputs according to an embodiment.

By keeping an average gate bias of FET 136 above the threshold voltage, the stability of its operation can be significantly improved over its operation when a harmonic input is used. In particular, the harmonic input requires an input bias to Class C (i.e., average gate bias below threshold), which leads to high negative instant input voltage values, which result in fast degradation of the operating parameters. To this extent, FIG. 5 shows an illustrative diagram comparing operation of FET 136 (FIG. 2) with both harmonic ("conventional Class E") and non-linear square wave ("Square-wave Class E") inputs according to an embodiment. As shown, from a stability point of view, an interval of instant gate biases ($V_G$) available rapidly decreases with an increase of the drain bias ($V_D$). By keeping the average gate bias above the threshold voltage or in the near sub-threshold regime, the non-linear square wave enables FET 136 to operate at higher drain voltage biases. It is noted that a scale for the X-axis is not indicated in FIG. 5 since the values for the stability region boundary vary for different device designs (e.g., field plate design, quantum well structure, and the like). However, the general concept will apply to all designs due to the field-assisted nature of the trapping primarily responsible for fast parameter degradation and field-actuated trap generation translated into long-term device parameter instabilities.

Returning to FIG. 2, for the illustrative implementation, preliminary results show that the corresponding periods of stable operation for each FET 110, 136 at room temperature can be as high as 10,000 hours. For FET 110, operating as a Class $F_N$ amplifier, the relatively long operation may be at least in part due to, for example, a low bias voltage used. For FET 136, the relatively long operation may be at least in part due to, for example, the quasi-Class A operation with respect to average gate bias, minimized input signal overshoots into both below-threshold and above-saturation regions, and/or the like.

FIG. 6 shows an illustrative power loss diagram of FET 136 operating as a Class E amplifier with a non-linear square wave input according to an embodiment. In general, there are three mechanisms for power loss: (a) OFF state power loss due to leakage current in FET 136 during the OFF portion of a cycle; (b) ON state power loss due to the FET 136 switch ON resistance (in general, the product of the knee voltage and saturation current) during the ON portion of the cycle; and (c) the switching power loss due to a product of instant drain voltage and current values during the transition process between the two states. By minimizing the switching power loss, which dominates for conventional (e.g., Class A, B, C, D) amplifiers, the non-linear square wave results in a high efficiency for the Class E mode of operation of FET 136. Additionally, the OFF state power loss can be considered as negligible due to an ability of FET 136 to withstand high drain biases without a significant rise in the leakage current. In this case, the total loss can be reduced to the ON state power loss, which makes the total loss independent of the drain voltage bias. As a result, the overall amplifier efficiency is only limited by a maximum drain voltage bias available.

Figure 7A:
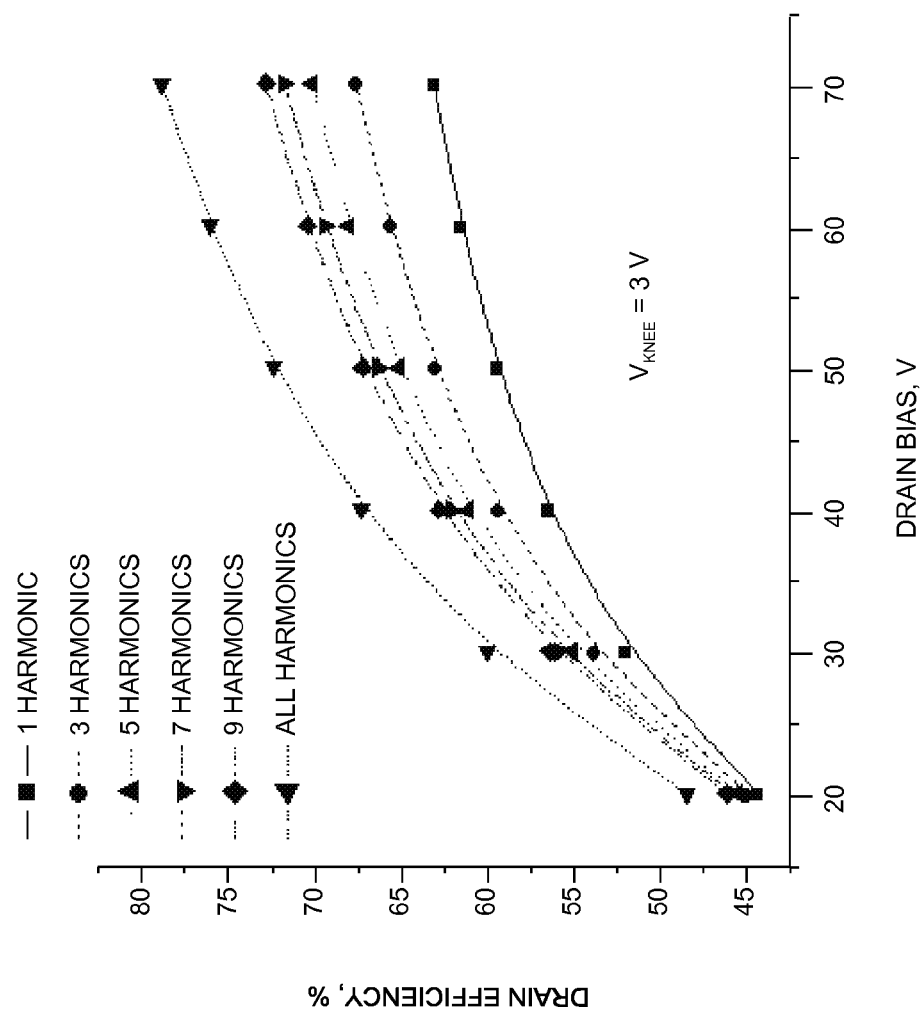
FIGS. 7A-B show calculated drain efficiencies of a Class E stage of an amplifier as a function of bias voltage and non-linear square wave input purity according to an embodiment.
Figure 7B:
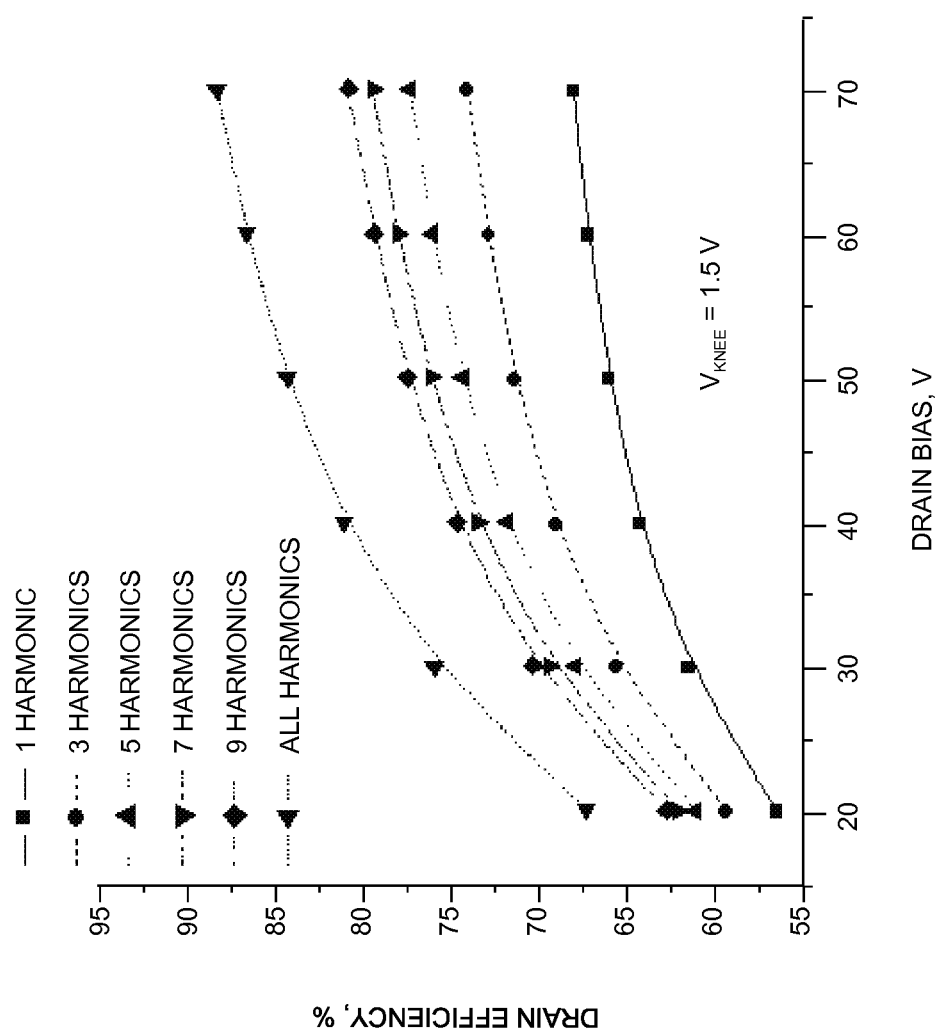

FIGS. 7A-B show calculated drain efficiencies of the Class E stage of the illustrative amplifier as a function of bias voltage and non-linear square wave input purity (e.g., number of harmonics) according to an embodiment. In FIG. 7A, the knee voltage is 3 Volts, while in FIG. 7B the knee voltage is 1.5 Volts. As illustrated, the drain efficiency rises as a function of the drain voltage bias and as a number of harmonics increases. In the case of nine harmonics and a drain voltage bias of 70 Volts, the drain efficiencies reach over seventy percent (knee voltage of 3 Volts) and over eighty percent (knee voltage of 1.5 Volts), respectively. To this extent, the device knee voltage, e.g., the channel ON resistance, should be minimized in order to get the highest efficiency.

With the drain voltage bias conditions extended up to 70 Volts or more and a higher number of harmonics, FET 136 (FIG. 2) can achieve power density levels up to and in excess of 20 Watts/millimeter with a drain efficiency up to 90% (90% of the DC power is converted to RF power). In the switching mode of operation, the total energy loss in FET 136 only weakly depends on the drain voltage bias. As a result, the self-heating effects are reduced to that of a low drain voltage bias operation. Further, reduced frequency limitations of FET 136 allow for a high breakdown design, e.g., extended gate-drain spacing, field plate attached to the gate of FET 136, and/or the like, to enhance the stability of FET 136. Still further, the device periphery of FET 136 and/or FET 110 (FIG. 2) can be scaled to achieve a desired total power level with similar efficiency and gain, as well as a stable operation period.

Returning to FIG. 1, while primarily shown and described as a circuit 30, aspects of the disclosure also provide a method of amplifying a signal. In particular, amplifier 10 generates a non-linear square wave based on a linear harmonic input and a voltage bias. As discussed herein, the non-linear square wave includes multiple harmonics, which provides a controlled amplitude and sharp fronts, and has the same frequency as the harmonic input. The non-linear square wave is provided as an input to a second amplifier 36, which has a high voltage bias. The second amplifier 36 generates a harmonic output, which can be filtered by a filter circuit 40 before being provided for further use by an output circuit 42.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. An amplifier circuit comprising:
    a group-III nitride based Heterostructure Field Effect Transistor (HFET) configured to operate as a multi-harmonic Class F amplifier; and
    an active amplifier, wherein an output of the Class F amplifier comprises an input of the active amplifier that limits a minimum instant current of a transistor in the active amplifier to not less than one percent of a maximum current for the transistor in the active amplifier.

2. The circuit of claim 1, wherein the active amplifier comprises a Class E amplifier.

3. The circuit of claim 1, wherein the active amplifier comprises a Heterostructure Field Effect Transistor (HFET).

4. The circuit of claim 3, wherein the HFET is constructed using group-III nitride-based material.

5. The circuit of claim 1, further comprising an input circuit for providing a harmonic input to the Class F amplifier.

6. The circuit of claim 1, further comprising a high voltage bias circuit for applying a voltage bias to the active amplifier.

7. The circuit of claim 6, wherein the voltage bias comprises at least fifty volts.

8. The circuit of claim 1, further comprising a filter circuit that receives an output of the active amplifier and generates a filtered output signal.

9. The circuit of claim 1, wherein the group-III nitride based HFET includes:
    a common electrode;
    a profiled gate including a plurality of gate sections; and
    a plurality of separate second electrodes, wherein each gate section corresponds to a unique one of the plurality of separate second electrodes.

10. A circuit comprising:
    a first field effect transistor (FET) operating as a multi-harmonic Class F amplifier; and
    an active FET, wherein an output of the Class F amplifier comprises an input of a gate of the active FET that limits a minimum instant current of the active FET to not less than one percent of a maximum current for the active FET.

11. The circuit of claim 10, further comprising a high voltage bias circuit for applying a voltage bias to a drain of the active FET.

12. The circuit of claim 11, wherein the voltage bias comprises at least fifty volts.

13. The circuit of claim 10, wherein the active amplifier comprises a Class E amplifier.

14. The circuit of claim 10, further comprising an input circuit for providing a harmonic input to the first field effect transistor.

15. The circuit of claim 10, wherein at least one of the first FET or the active FET comprises a Heterostructure Field Effect Transistor (HFET).

16. The circuit of claim 10, wherein at least one of the first FET or the active FET is constructed using group-III nitride-based material.

17. A method of amplifying a signal, the method comprising:
    receiving a harmonic input signal;
    generating a non-linear square wave based on the harmonic input signal using a first amplifier, wherein the first amplifier comprises a group-III nitride based Heterostructure Field Effect Transistor (HFET) configured to operate as a multi-harmonic Class F amplifier;
    providing the non-linear square wave as an input to a second amplifier, wherein the input limits a minimum instant current of a transistor in the active amplifier to not less than one percent of a maximum current for the transistor in the active amplifier; and
    amplifying the non-linear square wave using the second amplifier.

18. The method of claim 17, further comprising providing a high voltage bias to the second amplifier.

19. The method of claim 17, further comprising generating the harmonic input signal.

20. The method of claim 17, wherein the second amplifier comprises a group-III nitride-based Heterostructure Field Effect Transistor (HFET).

* * * * *